United States Patent
Vesnovsky et al.

(10) Patent No.: US 6,209,481 B1
(45) Date of Patent: Apr. 3, 2001

(54) SEQUENTIAL ION IMPLANTATION AND DEPOSITION (SIID) SYSTEM

(75) Inventors: Oleg Vesnovsky; Timmie Topoleski, both of Baltimore, MD (US); Vladimir Pomazenko, Tomsk (RU)

(73) Assignee: University of Maryland Baltimore County, Baltimore, MD (US)

(*) Notice: Subject to any disclaimer, the term of this patent is extended or adjusted under 35 U.S.C. 154(b) by 0 days.

(21) Appl. No.: 08/706,413

(22) Filed: Aug. 30, 1996

Related U.S. Application Data

(63) Continuation of application No. 08/706,414, filed on Aug. 30, 1996, now Pat. No. 6,083,567.

(51) Int. Cl.$^7$ ............................................... C23C 16/00
(52) U.S. Cl. .......................... 118/723 R; 118/723 FI; 204/298.04; 250/492.2
(58) Field of Search ............... 250/492.1, 492.2, 250/492.21, 493.1; 204/298.04, 298.05; 118/723 R, 723 CB, 723 FI; 156/345

(56) References Cited

U.S. PATENT DOCUMENTS

| | | |
|---|---|---|
| 4,357,182 | 11/1982 | Leveque . |
| 4,622,919 * | 11/1986 | Suzuki et al. ................. 118/718 |
| 4,629,631 | 12/1986 | Dearnaley . |
| 4,634,600 | 1/1987 | Shimizu et al. . |
| 4,683,149 | 7/1987 | Suzuki et al. . |
| 4,800,100 | 1/1989 | Herbots et al. . |
| 4,849,247 | 7/1989 | Scanlon et al. . |
| 4,915,746 | 4/1990 | Welsch . |
| 5,313,067 * | 5/1994 | Houk et al. ................. 250/452.21 |
| 5,401,544 * | 3/1995 | Nakahata et al. ............ 427/585 |
| 5,442,185 * | 8/1995 | Chan ......................... 250/492.21 |
| 5,480,527 * | 1/1996 | Welty ........................ 204/192.38 |
| 5,520,966 | 5/1996 | Kornely, Jr. . |
| 5,693,376 * | 12/1997 | Fetherston et al. ........... 427/523 |

* cited by examiner

Primary Examiner—Richard Bueker
Assistant Examiner—Luz Alejandro
(74) Attorney, Agent, or Firm—McDermott, Will & Emery

(57) ABSTRACT

A system for coating a surface of a substrate with a material includes a vacuum chamber and a vacuum pump configured to maintain a vacuum in the vacuum chamber. One or more ion source(s) are configured to implant ions of the material into the surface of a substrate disposed within the vacuum chamber to form an implanted substrate layer. The ion source(s) then deposit ions of the material onto the implanted substrate layer to form a seed layer. The ion source(s) next implant ions of the material into the seed layer to form an intermix layer and finally deposit ions of the material on the intermix layer to form the coating over the substrate.

16 Claims, 5 Drawing Sheets

SEQUENTIAL ION IMPLANTATION AND DEPOSITION (SIID) SYSTEM

CROSS REFERENCE TO RELATED APPLICATIONS

This application is a continuation of application Ser. No. 08/706,414, filed simultaneously herewith on Aug. 30, 1996, now U.S. Pat. No. 6,083,567 entitled Sequential Ion Implantation and Deposition (SIID) Technique.

TECHNICAL FIELD

The present invention relates to surface coatings and more particularly to an ion implantation and deposition technique for applying surface coatings.

BACKGROUND ART

Surface coatings are used to enhance the physical, mechanical and chemical surface properties of bulk materials, in order to reduce costs, conserve materials, and increase design flexibility. For example, optical coatings are used for lenses and mirrors and metallic coatings for electrical contacts. Coatings may be used to increase hardness and decrease wear. Protective coatings are applied to increase corrosion and oxidation resistance. Optimum coatings have excellent adhesion to the substrate to which they are applied, a dense and pore-free structure, good uniformity, and a smooth finish.

Coating techniques may be divided into two general classes, i.e. electroplating and vacuum coating. In electroplating, copper, hard and decorative chromium, nickel, cadmium, zinc, tin, silver, gold, or other materials are electro-chemically deposited onto a surface. In vacuum coating, different film production processes, such as chemical vapor deposition or physical vapor deposition, sputter deposition, ion plating, ion beam assisted deposition, arc deposition or others are used to create films.

The major difference between the two classes of coatings is the composition and/or thickness of the film and the resulting waste product production. Electroplating usually produces films from either single chemical elements, such as a metal, or a metal alloy, e.g., of two or more metals. In contrast, the majority of practical vacuum coating applications are directed toward creation of new surface chemical compounds.

The electroplating process creates a polluting waste water solution containing a high proportion of the deposited material, e.g., metal. Environmental regulatory standards are very strict and removing metals from the waste water is expensive, and requires multi-step processes. Water treatment greatly increases the cost of electro-deposition. In spite of steps taken to clean the water, only approximately 50% of the treated water is recycled in the electroplating process. The remaining water is toxic, and is released to the environment.

Ion implantation technologies are also used in vacuum coating processes. The largest disadvantage of ion implantation for industrial applications is the high cost of capital equipment and the total cost to implement the process. For example, in 1988, commercial rates for nitrogen ion implantation surface treatments were about $650.00 per batch. A batch typically consists of items mounted on a 250 $cm^2$ rotatable plate which can be completely rotated to ensure uniform implantation. For implantation of irregularly shaped items, where specialized jigging and/or rotations are required, costs were higher, at least for the initial batch. For a cost of capital equipment of $1,000,000 and using ten years of amortizing, hourly rates of $144.12, $95.00 and $73.70 apply for one shift, two shifts, and three shifts, respectively. Accordingly, the cost of this type of vacuum coating can be significantly more expensive than electroplating.

Electroplated coatings are typically used under mild conditions, such as for decorative chrome finishes on appliances, or as corrosion resistant finishes, for example zinc, on roofing materials. If a material faces harsh or destructive conditions, vacuum coating processes are commonly used.

Electroplating provides strong adhesion between the deposited material and the substrate. In vacuum coating, it is believed that an intermix layer between the substrate and film can be used to improve adhesion. However, the majority of modern deposition techniques, such as ion beam deposition, molecular beam epitaxy, sputtering, laser ablation, or anodic and cathodic arc plasma deposition, do not produce an intermixed layer and are not appropriate for use when strong adhesion is necessary.

Several approaches have been proposed to simplify and reduce the cost of implantation processes. The proposals typically involve reduction of capital equipment cost. Simplified systems include plasma immersion, ion implantation or plasma source ion implantation, producing heavy ion beams from a solid using a metal vapor arc discharge in a pulsed mode, and metallic ion production into a PIG ion source. In the future, it may be possible to reduce the implantation cost by increasing the size of certain equipment. If the cost of ion implantation can be sufficiently reduced, it may be possible to replace electroplating with vacuum coating in many if not all coating applications.

OBJECTIVES OF THE INVENTION

It is an object of the present invention to provide a vacuum coating technique suitable for replacing electroplating techniques currently in use.

It is another object of the present invention to provide a vacuum coating technique which results in improved adhesion between the coating and the substrate.

It is a further object of the present invention to provide an environmentally friendly technique for plating a substrate with electro-conductive or non-electro-conductive materials.

It is a still further object of the present invention to provide a technique for plating a substrate with electro-conductive or non-electro-conductive materials which eliminates or substantially reduces polluting by-products.

It is yet another object of the present invention to provide a reduced cost technique for vacuum coating a substrate using direct ion implantation in combination with ion deposition.

Additional objects, advantages, novel features of the present invention will become apparent to those skilled in the art from this disclosure, including the following detailed description, as well as by practice of the invention. While the invention is described below with reference to a preferred embodiment(s), it should be understood that the invention is not limited thereto. Those of ordinary skill in the art having access to the teachings herein will recognize additional applications, modifications, and embodiments in other fields, which are within the scope of the invention as disclosed and claimed herein and with respect to which the invention could be of significant utility.

SUMMARY OF THE INVENTION

In accordance with the invention, a vacuum coating process for coating a surface of a substrate with a material includes implanting first ions of the coating material into the surface of the substrate to form an implanted substrate layer. Second ions of the same material are next deposited on the implanted substrate layer to form a seed layer. Third ions of the same material are then implanted into the seed layer to form an intermixed layer. To form the intermixed layer, the third ions are implanted into the seed layer and may also be implanted into at least a portion of the thickness of substrate layer in a direction perpendicular to the surface of the substrate. Finally, fourth ions of the material are deposited on the intermixed layer to form the coating of the material on the substrate. The implanted and deposited ions are from a single ion source.

Preferably the ions are implanted and deposited in a single state which is a plasma and are formed by bombarding a cathode of the coating material in a solid state with ions of a different material in a plasma state. According to other aspects of the invention, the substrate may be formed of electro-conductive or non-electro-conductive material and the coating material is also a electro-conductive or non-conductive material. Typically, the materials will be different. For example the substrate may be formed of steel while the coating is chrome.

A coated substrate is also provided which includes a substrate formed of a first material and having a surface and a thickness in a direction perpendicular to said surface. A first layer formed of first ions of a second material implanted in the first material is disposed over the substrate surface and has a thickness perpendicular to the surface of the substrate. A second layer formed of second ions of the second material implanted into deposited third ions of the second material is disposed over the first layer and has a thickness extending perpendicular to the surface of the substrate. The thickness of the second layer is typically less than the thickness of the first layer. A third layer formed of deposited fourth ions of the second material is formed over the second layer and has a thickness perpendicular to the surface of the substrate, thus covering the substrate surface.

The coated substrate may also include additional layers. Preferably, a fourth layer formed of the first ions and the second ions implanted in the first material which is provided over the first layer and under the second layer and has a thickness extending perpendicular to the surface of the substrate. Additionally, a fifth layer formed of the first ions, the second ions and the third ions is provided over the fourth layer and under the second layer and has a thickness perpendicular to the surface of the substrate.

In accordance with further aspects of the invention, a system is provided for coating a surface of a substrate, e.g. a steel substrate, with a material, e.g. chrome. The system includes a vacuum chamber and a vacuum pump which is configured to maintain a desired vacuum within the vacuum chamber. At least one single ion source is provided to implant first ions of the material into the surface of a substrate disposed within the vacuum chamber to form an implanted substrate layer, to deposit second ions of the material on the implanted substrate layer to form a seed layer, to implant third ions of the material into the seed layer to form an intermix layer, and to deposit fourth ions of the material on the intermix layer to form a coating of the material on the substrate. Each single ion source is configured to implant and deposit the ions in a single state, e.g. a plasma state, the ions being produced by bombarding a single cathode of the material in a solid state with ions of a different material in a plasma state. In certain implementations, it may also be beneficial to add additional one or more ion source(s) which are solely used to either implant or deposit ions after the seed or intermix layer has been created by the dual mode single ion source(s). In a still further alternative, separate ion sources are operated to respectively implant or deposit ions of the same material on the substrate.

In operation, a vacuum is established within the chamber and one or more voltages, e.g. three voltages may be applied, to an ion source to form the working gas, to form the sputter electrode and to accelerate the ions. The vacuum and voltages will be set at one set of values to implant ions of the material into the substrate. One or more or these values will be changed to deposit ions of the material on the substrate.

BEST MODE FOR CARRYING OUT THE INVENTION

Figure 1:
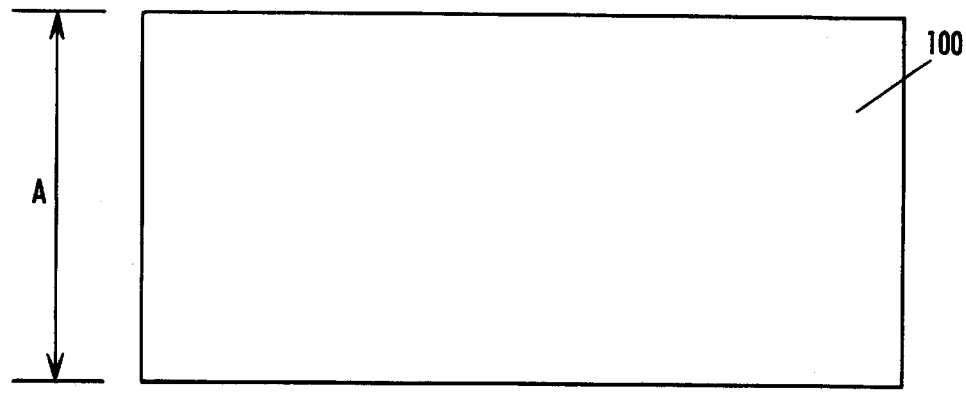
FIG. 1 is a cross-sectional view of a substrate prior to treatment.

FIG. 1 is a cross-sectional view of a substrate 100 prior to any implantation or deposition of ions. The substrate shown is 1045 steel but could be formed of virtually any other material requiring a surface coating. For example, a different metal, a glass, a catalytic, a ceramic, a polymeric, a composite, or any other electro-conductive or non-electro-conductive material could be utilized if desired. Likewise, although the preferred embodiment will be discussed in terms of coating the steel substrate with chromium, other coating materials, i.e. any electro-conductive or non-electro-conductive materials, could be used as may be desirable for the particular application. It will also be recognized that the invention could be easily adapted for use in the manufacture of semiconductor chips. As depicted in FIG. 1, the substrate 100 has a thickness A.

Figure 2:
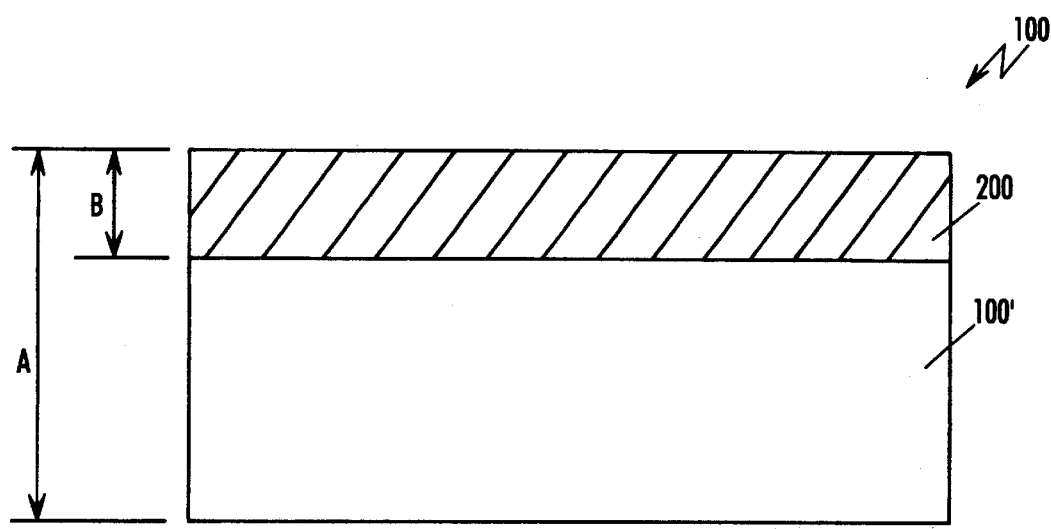
FIG. 2 is a cross-sectional view of the FIG. 1 substrate after an initial implantation.

Referring now to FIG. 2, the substrate 100 is treated with an initial chromium ion implantation thereby forming a layer 200 in the substrate 100 having a thickness B. The implanted ions are applied in a plasma state to the primary surface of the substrate 100 to form the layer 200. The portion of the substrate 100 which has not been penetrated by the implanted ions is designated 100'.

Figure 3:
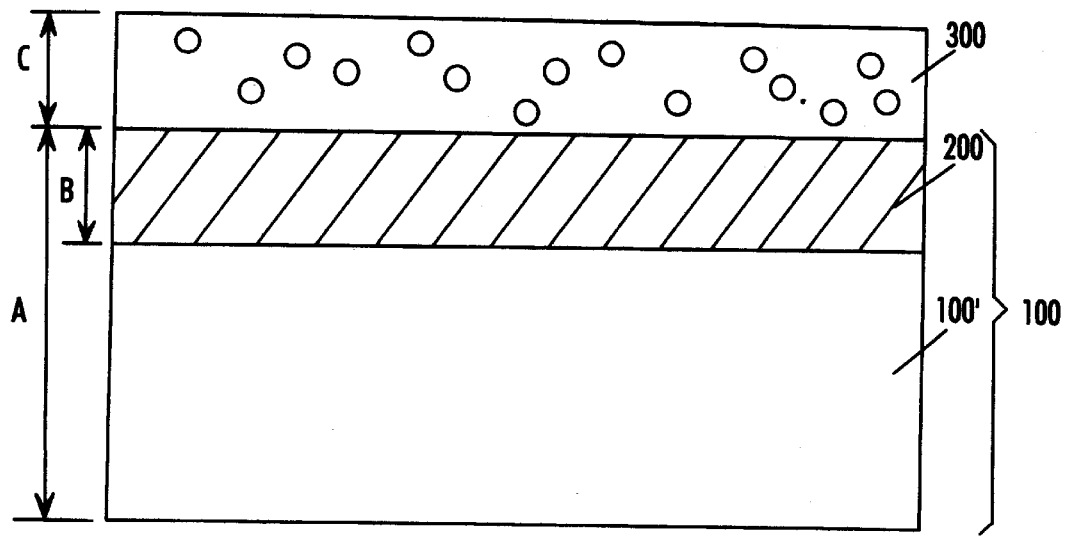
FIG. 3 is a cross-sectional view of the FIG. 2 substrate after depositing a seed layer.

FIG. 3 depicts a seed layer 300 which is formed by depositing chromium ions in a plasma form on the primary surface of the implanted layer 200. The seed layer has a thickness C which is exaggerated in FIG. 3. The thickness C of layer 300 is preferably substantially smaller than the thickness B of the layer 200. It should be noted that layer 200 and layer 300 are both formed by applying chromium ions in a plasma state. Hence, a single ion source can be utilized for both implantation and deposition of the ions.

Figure 4:
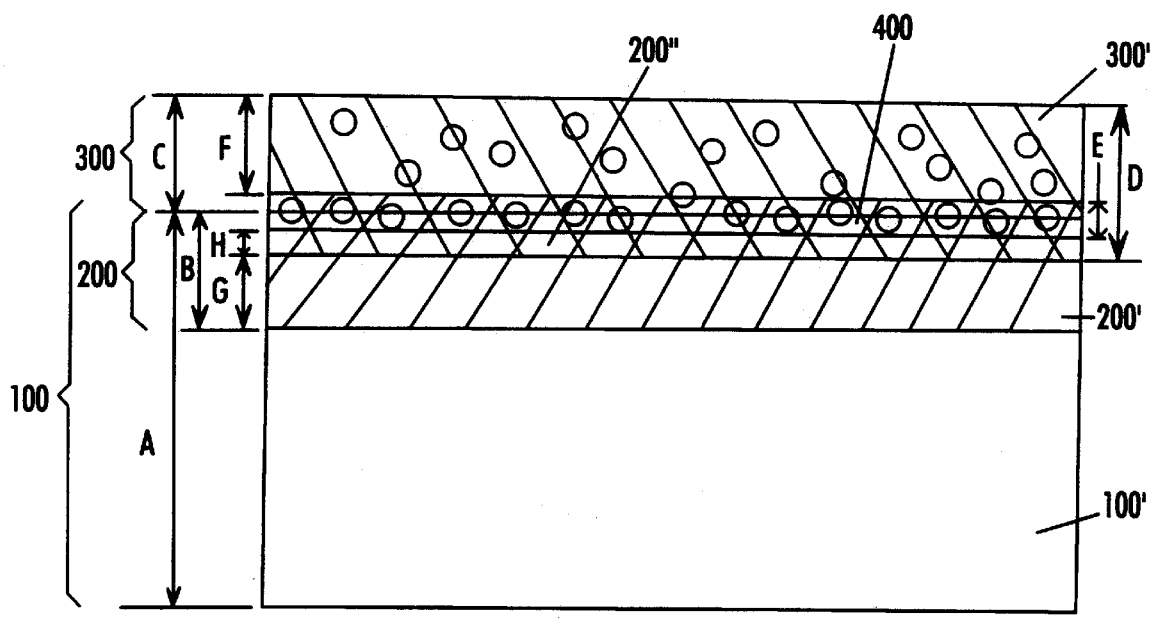
FIG. 4 is a cross-sectional view of the FIG. 3 substrate after a secondary implantation.

Referring now to FIG. 4, a secondary implantation of chromium ions is made to the seed layer 300 and implanted substrate layer 200 of FIG. 3 by applying energetic chromium ions in a plasma state. As depicted in FIG. 4, the implanted ions penetrate through a thickness D of the treated substrate depicted in FIG. 3. Accordingly, the implanted chromium ions extend through the seed layer 300 and into layer 200 depicted in FIG. 3, thereby actually forming three different layers, i.e., layer 200" having a thickness H, layer 400 having a thickness E and layer 300' having a thickness F. It should also be noted that the thickness of layer 200', which includes ions only from the initial implantation of the substrate 100, reflects a reduction in the thickness of layer 200 from a thickness B to the thickness G of layer 200' as indicated in FIG. 4. It may be advantageous for the intermix layer to be formed by a series of depositions, each deposition being followed by an implantation.

The newly formed layer 200" is an intermixed layer including ions implanted in the substrate during both the initial and secondary implantations. The layer 400 is also an intermixed layer formed during the secondary implantation of chromium ions. The layer extends into both the implantation layer 200 and the seed layer 300 depicted in FIG. 3. This layer includes chromium ions applied during the initial implantation, the depositing of the seed layer and the secondary implantation. This mixing of the chromium ions applied during the different stages of the process increases the adhesion of the seed layer 300 of FIG. 3 to the substrate 100.

Ion implantation before the deposition of the seed layer 300 eliminates the need to heat the substrate to achieve film adhesion of seed layer 300 to the substrate 100 and the additional ion implantation after seed layer 300 deposition serves to further increase the seed layer adhesion to the substrate. Residual stresses is created by ion implantation and deposition, and a sudden transition between the two processes could possibly increase the internal stresses in the portion of the substrate proximate to the surface coating and in the surface coating itself. Such residual stresses can also cause degraded adhesion. Accordingly, ion implantation and deposition may beneficially both be performed using one or more single ion sources, each of which operates in the two modes, i.e., ion implantation and ion deposition, such that the transition between the two modes is smooth and continuous thereby reducing any residual stresses which might be otherwise introduced. However, this is not necessarily mandatory.

Figure 5:
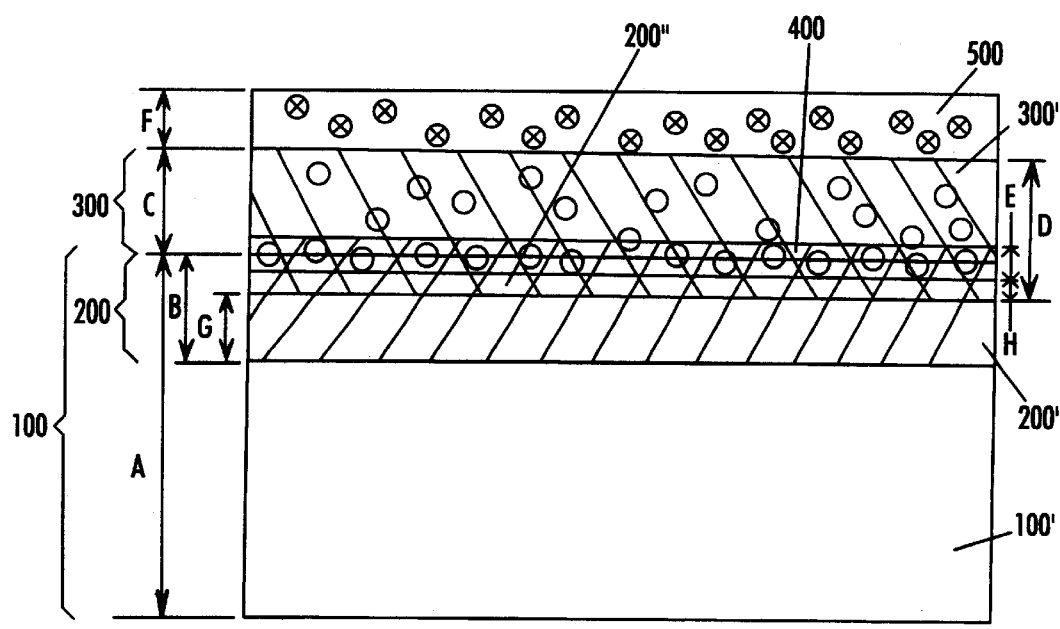
FIG. 5 is a cross-sectional view of the FIG. 4 substrate after coating in accordance with the present invention.

Turning now to FIG. 5, a final deposit of chromium ions of the same material as those previously implanted and deposited is applied in a plasma state over the previously treated substrate depicted in FIG. 4 to form a chromium film layer 500 covering the outer surface of the substrate 100. This final deposition layer 500 serves as the surface coating for the substrate 100. Because the final layer 500 is formed of exactly the same material as the seed layer 300, the surface layer 500 has improved adhesion to the seed layer 300 which is, in turn, strongly adhered to the substrate 100 as a result of the multiple implantation.

As shown in FIG. 5, the resulting coated substrate includes a first layer 200' of chromium ions implanted in the substrate. A second layer 200" includes first and second chromium ions of the same material implanted in the substrate during the two implantation stages. A third layer 400 is provided which includes first, second and third ions respectively associated with the first and second implantation and the deposit of the seed layer 300 all mixed with ions of the substrate 100. A fourth layer 300' includes ions deposited to form the seed layer 300 and ions implanted during the second implantation stage of the above-described process. Finally, a surface layer 500 is also provided comprised of ions deposited in the final stage of the process to form a fifth layer.

It will be understood that the inventive sequential ion implantation and deposition (SIID) technique described above is related to, but different from, other deposition techniques such as metal plasma immersion ion implantation and deposition (MPI) and ion beam assisted deposition (IBAD). The basis of IBAD is simultaneous implantation and deposition from two or more different ion sources. For example, IBAD uses primarily argon gas to bombard a thin surface film, to produce some mixing of the atoms simultaneously deposited from a different source with the substrate. MPI uses successive implantation and deposition of ions of different materials respectively from different sources. In both of these techniques, energetic implanted ions are in a gaseous state and produced from one solid source, and the deposited ions are in a non-gaseous state and produced from a different solid source. In the present technique, ions produced for implantation and deposition are in the same state, and are produced from a single ion source. Implanting ions of the same element as the deposited ions using the present technique results in superior adhesion.

Figure 6:
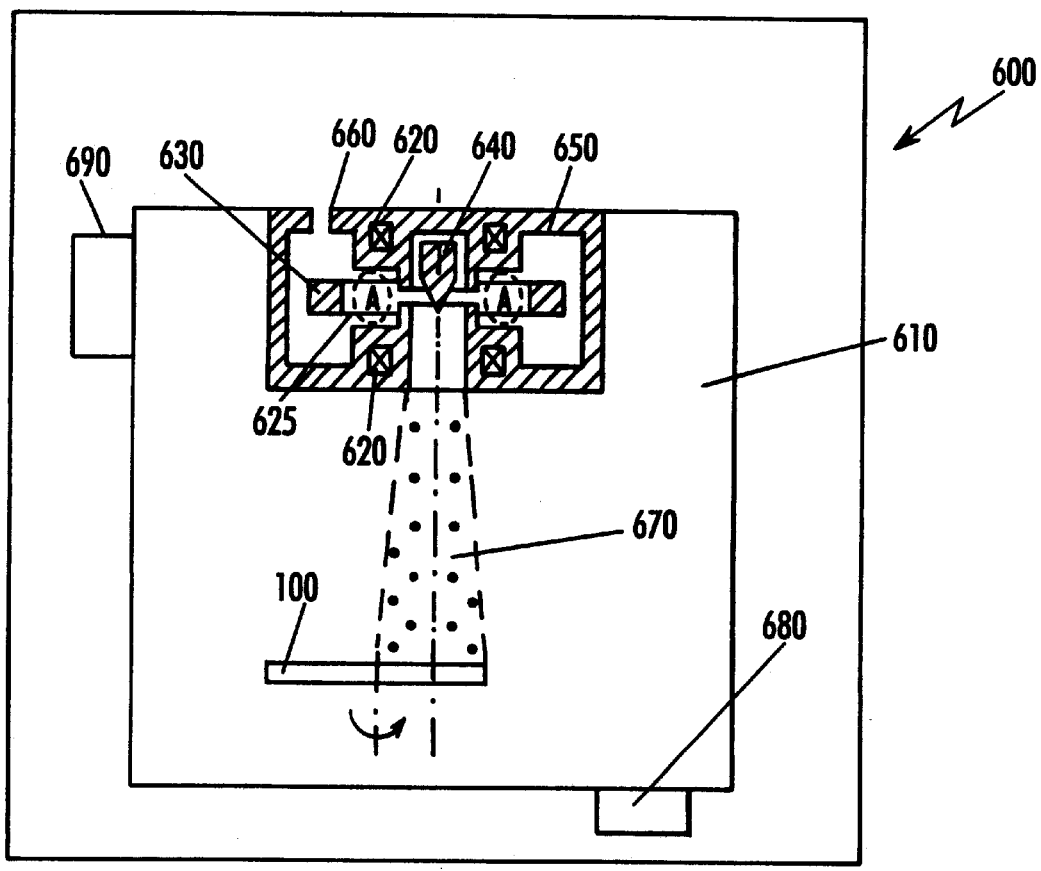
FIG. 6 depicts an exemplary single ion source in accordance with the present invention.

Referring now to FIG. 6, an exemplary ion implantation and deposition device 600 suitable for performing implantation and depositions in accordance with the present invention is depicted. The device 600 includes a vacuum chamber 610 and associated vacuum pumps 680 for maintaining an appropriate environment for the implantation and deposition of chromium ions. A housing 650, which houses the depicted Penning discharge ion source, is located within the vacuum chamber. Voltage source 690 provides power to the ion source. It will be recognized that another type of ion source could, if desired, be substituted for the Penning discharge source.

The ion source includes permanent magnets 620 and anode 630. A gas inlet 660 is provided for introducing working ions in a plasma state. A sputtering chromium cathode 640 is disposed substantially centered within the anode 630. A space 625 is located between the anode 630 and sputtering cathode 640 in which argon (Ar) plasma which is the preferred working gas for the depicted exemplary ion source, is present. The argon ions bombard the chromium cathode 640 and chromium ions are driven out in a plasma stream 670 and implanted or deposited on the substrate 100 which is also located within the vacuum chamber 610. It should be noted that although the device 600 described with reference to FIG. 6 utilizes a chromium cathode 640 and argon plasma, other materials could be utilized as may be desirable for the particular implementation of the invention.

It will be recognized that the use of the above-described invention facilitates reduction or elimination of environmentally harmful aspects of conventional surface coating techniques such as electroplating. The present invention has potential applications in the production of virtually any single element or multi-element composite film created on a substrate. For example, the present invention may have applications in such diverse fields as toolmaking, the manufacture of semiconductor chips and biotechnology. The technique could be applied in creating more wear resistant alloys for use as bearing biomaterials and for creating superior catalytic electrodes for use in dialysis.

Several parameters can be controlled during the implantation and deposition stages of the technique described above. For example, the time period during which ions are implanted or deposited will necessarily need to be optimized for the particular implementation of the invention. The ion beam voltage, vacuum and current density along with the purity of the sputtering cathode (690) and working gas, will typically also affect the quality of the resulting film.

The depicted ion source operates in two modes, i.e. ion implantation and ion deposition. Transfer from one mode to another occurs by changing the vacuum in the chamber 610 and the electrical voltages from voltage source 690 which are used for forming argon plasma, for sputtering the chromium cathode, and for accelerating the ions as illustrated in Table 1 below. The specific values of the parameters will of course depend on the implanted/deposited material. The required thickness of the film can be controlled by increasing the ion deposition time.

TABLE 1

Examples of Parameters for ion implantation and ion deposition

| Work Vacuum | $\times 10^{-4}$ Torr | Implantation ≈2 | Deposition ≈3 |
|---|---|---|---|
| Forming Ar Plasma | Voltage (V) | 400–500 | 300–450 |
|  | Current (A) | 0.5–1.2 | 0.7–1.5 |
| Sputtering Cr Cathode | Voltage (V) | 1000–1500 | 500–13000 |
|  | Current (A) | 0.2–0.25 | 0.25–0.4 |
| Acceleration | Voltage (kV) | 30–45 | 0.15–1.0 |
|  | Current (mA) | 25–35 | 40–50 |

Traditional ion beam implantation equipment, for example that which is utilized conventionally in semiconductor applications, is very expensive because ion accelerators and mass separators are used to focus and scan a narrow ion beam over the substrate. Accelerators and mass separators are not required in device 600 to implement the above described technique. The device 600 is thus simplified and has improved reliability as compared to major currently used ion implantation equipment.

The Penning discharge ion source was developed over 50 years ago, but its applications depend on the specific design parameters. For example, "Aisenberg" ion sources are conventionally used only for ion beam deposition, while "Vesnovsky-Brukhov" ion sources are conventionally used only for ion implantation. The ion source in accordance with the present invention, as illustrated in FIG. 6, is an improvement over the "Vesnovsky-Brukhov" ion source, and can be used for both ion implantation and ion deposition.

Figure 7:
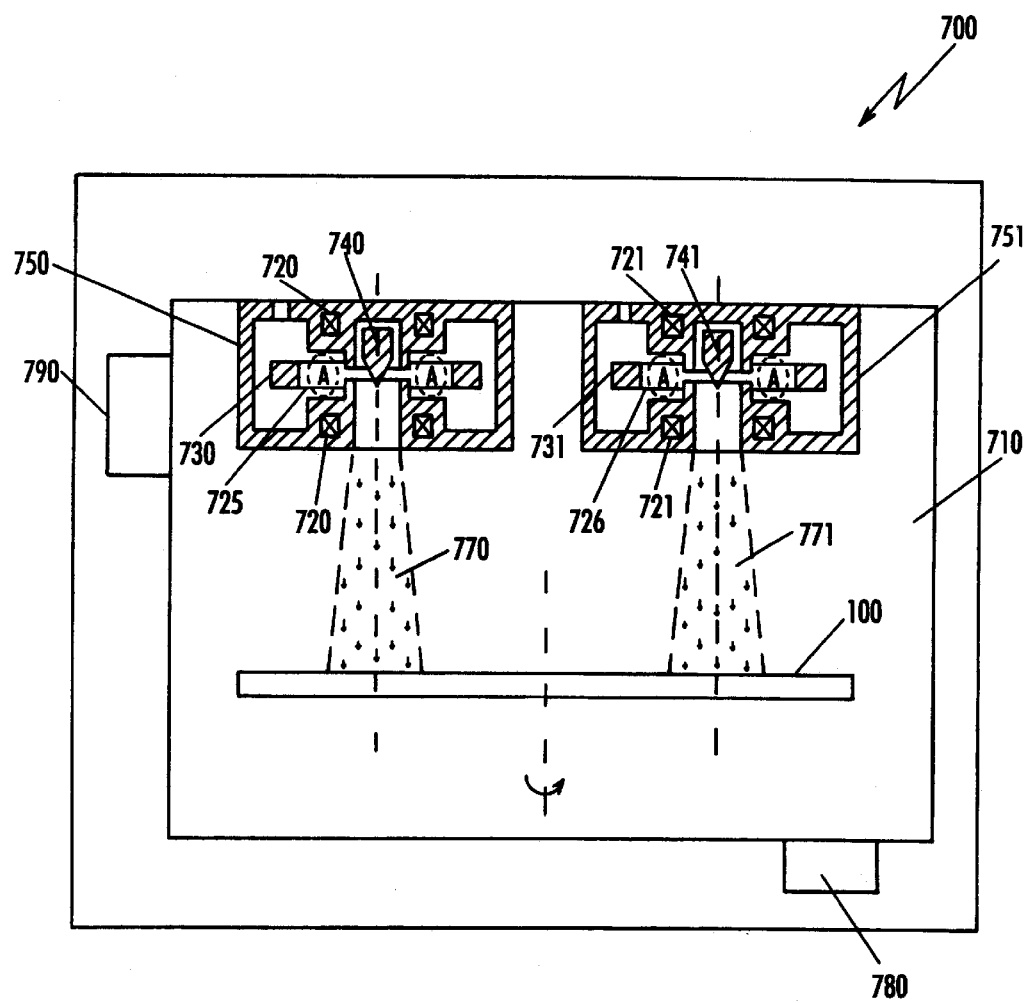
FIG. 7 depicts an exemplary dual single ion source in accordance with the present invention.

FIG. 7 depicts an exemplary ion implantation and deposition device 700 which incorporates multiple single ion sources for implanting and depositing ions in accordance with the present invention. Device 700 includes a vacuum chamber 710 and associated pump 780 for maintaining an appropriate environment for the implantation and deposition of chromium ions. Housings 750 and 751 are disposed within the vacuum chamber and respectively house a Penning discharge type single ion source. Voltage source 790 provides power to the respective ion sources. As discussed above, although Penning discharge type ion sources are depicted, another type of single ion source could be utilized, if desired. Additionally, one of the sources could, if desired, be an ion source configured to operate in a single mode, i.e., either to implant or deposit ions on the seed or intermix layer created with the dual mode single ion source. Alternatively, the two sources depicted could each operate in a single mode. That is, one ion source could be operable to implant chromium ions and the other ion source could be operable to deposit chromium ions. The ion sources would be operated sequentially to form the layers as detailed above.

Hence, the two ion sources may be substantially identical, or one source may be operable in a dual mode and the other only a single mode. In any event, each includes permanent magnets 720 or 721 and anodes 730 or 731. One of the single ion sources includes a sputtering chromium cathode 740 while the other includes sputtering chromium cathode 741. As discussed in the FIG. 6 embodiment, the sputtering cathodes 740 and 741 are disposed substantially centered within its corresponding anode 730 or 731. A space 725 or 726 is provided between the anode 730 and cathode 740 and the anode 731 and cathode 741 for operating on the working gas, in this case argon (Ar), to form the argon plasma. As has been discussed previously, the argon ions bombard the chromium cathodes 740, 741 to dislodge and energize the chromium ions thereby forming plasma streams 770 and 771 to implant or deposit chromium ions on the substrate 100, which is also located in the vacuum chamber 710.

The dual ion source(s) shown in FIG. 7, if operable in a dual mode, operate in substantially the same manner as described above with reference to the FIG. 6 configuration. However, because dual single ion sources are utilized, implantation and deposition can be performed substantially faster. For example, the time period during which ions are implanted or deposited can be reduced in half using the dual single ion source configuration depicted in FIG. 7 as compared to the single ion source configuration depicted in FIG. 6. Of course, even a greater number of single ion sources could be utilized if desired, thereby further reducing the required time for each sequential implantation and deposition of ions. If one or both of the sources operate in a single mode, each would be operated as previously described only during either the implantation or deposition of ions, as applicable.

In a typical application, the substrate 100 may be rotated on a supporting platform while being exposed to sequentially implanted and deposited ions from the single ion source of FIG. 6 or each of the single ion sources of FIG. 7. It will be understood by those skilled in the art that, rather than rotating the substrate 100 during implantation and deposition of ions, the substrate could be moved linearly, by for example a conveyor, with the plasma stream or streams being arranged to provide the required coverage over the substrate 100 surface as it is conveyed beneath the single or multiple single ion sources.

Further still, if desired, the ion source or sources could be moved over the stationary substrate or both the single ion source(s) and substrate could be moved in a synchronized fashion to provide the desired coverage of the substrate surface during sequential implantations and depositions. It will also be recognized that the specimen is preferably introduced into and out of the chamber 710 via an "air lock" (not shown) so that the entire chamber 710 need not be re-evacuated each time a substrate is introduced or removed from the chamber This will reduce the power use of the vacuum pump 780, as well as the time required for the substrate 100 to remain in the vacuum chamber in order to perform the required operations.

As described above, the present invention provides a vacuum coating technique suitable for replacing electroplating techniques now in use. The invention provides improved adhesion qualities between a coating and substrate. The invention also provides a coating process which virtually, if not totally, eliminates non-recyclable waste water and has a reduced detrimental impact on the environment. The described invention also reduces the cost of coating a substrate using ion implantation.

It will also be recognized by those skilled in the art that, while the invention has been described above in terms of a preferred embodiment(s) it is not limited thereto. Various features and aspects of the above described invention may be used individually or jointly. Further, although the invention has been described in the context of one or more particular implementations, those skilled in the art will recognize that its usefulness is not limited thereto and that the present invention can be beneficially utilized in any number of implementations and applications. Accordingly, the claims set forth below should be construed in view of the full breath and spirit of the invention as disclosed herein.

What is claimed is:

1. A system for coating a surface of an electro-conductive or non-electro-conductive substrate with an electro-conductive or non-electro-conductive material, comprising:
    a vacuum chamber;
    a vacuum pump configured to maintain a vacuum in the vacuum chamber; and
    a single ion source configured to sequentially implant and deposit ions with a smooth and continuous transition therebetween which implants first ions of the material into the surface of a substrate disposed within said vacuum chamber to form an implanted substrate layer, to deposit second ions of the material on the implanted substrate layer to form a seed layer, to implant third ions of the material into the seed layer to form an intermix layer, and to deposit fourth ions of the material on the intermix layer to form the coating on the substrate, wherein the single ion source includes a single cathode formed of the material in a solid state and is configured to implant and deposit the ions by bombarding the single cathode with ions of a different material in a gaseous state to thereby dislodge particles of the material from the cathode and selectively energize the dislodged particles for implantation or deposition.

2. A system according to claim 1, wherein the single ion source is configured to implant and deposit the ions in a single state.

3. A system according to claim 1, wherein the single ion source is configured to implant and deposit the ions in a plasma state.

4. A system according to claim 1, wherein the single ion source is configured such that the third ions are implanted into at least a portion of the thickness of the implanted substrate layer.

5. A system according to claim 1, wherein the substrate is formed of a first metal and the material is a second metal which is different from the first metal.

6. A system according to claim 1, wherein the substrate is formed of steel and the material is chromium.

7. A system according to claim 1, wherein the single ion source is operable such that a thickness of the implanted substrate layer is greater than a thickness of the seed layer.

8. A system according to claim 1, wherein the vacuum pump is configured to maintain a first vacuum within the chamber during ion implantation and to maintain a second vacuum, different from the first vacuum, within the chamber for ion deposition.

9. A system according to claim 1, further comprising a voltage source configured to apply at least one voltage to the ion source during ion implantation and to apply at least one different voltage to the ion source during ion deposition.

10. A system according to claim 1, further comprising a voltage source configured to apply a first voltage to the ion source during ion implantation and to apply a second voltage, different from said first voltage, to the ion source during ion deposition, and wherein the vacuum pump is configured to maintain a first vacuum within the chamber during ion implantation and to maintain a second vacuum, different from the first vacuum, within the chamber during ion deposition.

11. A system for coating a surface of a substrate, comprising:
    a vacuum chamber; and
    at least one ion source configured to sequentially implant and deposit ions with a smooth and continuous transition therebetween which implants first ions of a material into a substrate disposed within said vacuum chamber, and to deposit second ions of the material onto the substrate, wherein said at least one ion source includes a cathode formed of the material in a solid state and is configured to implant and deposit the ions by bombarding the cathode with ions of a different material in a gaseous state to thereby dislodge particles of the material from the cathode and selectively energize the dislodged particles for implantation or deposition.

12. A system according to claim 11, wherein said at least one ion source is configured to implant and deposit the ions in a plasma state.

13. A system according to claim 11, further comprising at least one additional ion source configured to either implant ions into or deposit ions onto the substrate after the sequential implantation of said first ions of the material and deposition of said second ions of the material.

14. A system according to claim 11, further comprising a vacuum pump configured to maintain a first vacuum within the chamber during ion implantation and to maintain a second vacuum, different than the first vacuum, within the chamber during ion deposition.

15. A system according to claim 11, further comprising a voltage source configured to apply at least one voltage to said at least one ion source during ion implantation and to apply at least one different voltage to said at least one ion source during ion deposition.

16. A system according to claim 11, further comprising a voltage source configured to apply at least one voltage to said at least one ion source to implant ions of the material and to apply at least one different voltage to said at least one ion source to deposit ions of the material, and a vacuum pump configured to maintain a vacuum within the chamber during ion implantation and to maintain a different vacuum within the chamber during ion deposition.

* * * * *